US008754798B2

(12) United States Patent
Lin

(10) Patent No.: US 8,754,798 B2
(45) Date of Patent: Jun. 17, 2014

(54) HIGH-SPEED SUCCESSIVE-APPROXIMATION-REGISTER ANALOG-TO-DIGITAL CONVERTER AND METHOD THEREOF

(71) Applicant: Realtek Semiconductor Corp., Hsinchu (TW)

(72) Inventor: Chia-Liang Lin, Fremont, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 34 days.

(21) Appl. No.: 13/706,600

(22) Filed: Dec. 6, 2012

(65) Prior Publication Data

US 2013/0162454 A1 Jun. 27, 2013

Related U.S. Application Data

(60) Provisional application No. 61/578,246, filed on Dec. 21, 2011.

(51) Int. Cl.
*H03M 1/12* (2006.01)
*H03M 1/38* (2006.01)
*H03M 1/10* (2006.01)

(52) U.S. Cl.
CPC . *H03M 1/38* (2013.01); *H03M 1/10* (2013.01)
USPC ........... 341/155; 341/118; 341/120; 341/163; 341/172

(58) Field of Classification Search
CPC ..... H03M 1/468; H03M 1/804; H03M 1/462; H03M 1/38; H03M 1/466
USPC .................................. 341/118, 120, 155, 172
See application file for complete search history.

(56) References Cited

U.S. PATENT DOCUMENTS

| | | | | |
|---|---|---|---|---|
| 5,920,275 A | * | 7/1999 | Hester | 341/172 |
| 6,313,779 B1 | * | 11/2001 | Leung et al. | 341/155 |
| 7,265,694 B2 | * | 9/2007 | Guidry | 341/120 |
| 7,511,648 B2 | * | 3/2009 | Trifonov et al. | 341/143 |
| 7,576,678 B2 | * | 8/2009 | Chatal et al. | 341/163 |
| 7,812,757 B1 | * | 10/2010 | Wong et al. | 341/172 |
| 7,876,254 B2 | * | 1/2011 | Berens et al. | 341/163 |
| 8,159,382 B2 | * | 4/2012 | Srinivasa et al. | 341/156 |
| 8,294,607 B2 | * | 10/2012 | Rao et al. | 341/169 |
| 8,344,903 B2 | * | 1/2013 | Ogasawara et al. | 340/815.78 |
| 8,344,931 B2 | * | 1/2013 | Zhu et al. | 341/172 |
| 8,378,863 B2 | * | 2/2013 | Ishikawa | 341/118 |

* cited by examiner

*Primary Examiner* — Linh Nguyen
(74) *Attorney, Agent, or Firm* — McClure, Qualey & Rodack, LLP

(57) ABSTRACT

In one embodiment, a SAR (successive-approximation register) ADC (analog-to-digital converter) comprising: a plurality of capacitors, a switch controlled by a sampling signal for connecting a common node to a ground node when the sampling signal is asserted; a plurality of switching networks controlled by the sampling signal and a plurality of control bits comprising a respective grounding bit and a respective data bit, each of the plurality of switching networks for connecting a bottom plate of a respective capacitor to an analog input signal, a ground node, a first reference voltage, or a second reference voltage depending on the asserted signal or bit; a comparator for detecting a polarity of a voltage at the common node and outputting a binary decision along with a complementary binary decision when a comparing signal is asserted; a logic gate for receiving the binary decision and the complementary binary decision and outputting a ready signal indicating whether a decision is readily made; a timer for receiving the comparing signal and outputting a time out signal; and a SAR logic for receiving the binary decision, the ready signal, and the time out signal and outputting the sampling signal, the comparing signal, the plurality of control bits, and an output data.

32 Claims, 7 Drawing Sheets

HIGH-SPEED SUCCESSIVE-APPROXIMATION-REGISTER ANALOG-TO-DIGITAL CONVERTER AND METHOD THEREOF

The present application claims the benefit of U.S. provisional application No. 61/578,246, titled "HIGH-SPEED SUCCESSIVE-APPROXIMATION-REGISTER ANALOG-TO-DIGITAL CONVERTER AND METHOD THEREOF", filed Dec. 21, 2011.

FIELD OF TECHNOLOGY

This disclosure relates to a successive-approximation-register analog-to-digital converter.

BACKGROUND

Successive-Approximation-Register (SAR) type analog-to-digital converters (ADCs) are widely used in many applications. A schematic diagram of a conventional N-bit SAR ADC 100 is depicted in FIG. 1. ADC 100 converts an analog input signal $V_{IN}$ into a digital output data D and comprises: N capacitors 101, 102, ..., 105 having capacitances $C_{N-1}$, $C_{N-2}$, ..., $C_0$, respectively, an additional capacitor 106 having capacitance $C_0$ wherein all top plates of the N capacitors 101, 102, ..., 105 and the additional capacitor 106 are tied together to a common circuit node 121; a switch 120 for connecting the common circuit node 121 to a ground node upon insertion of a sampling signal SAMP; N single pole triple throw (SPTT) switches 111, 112, ..., 115 for respectively connecting the bottom plates of the N capacitors 101, 102, ..., 105 to one of the analog input signal $V_{IN}$, a positive reference voltage $V_R$, and a negative reference voltage $-V_R$; a single pole double throw (SPDT) switch 116 for connecting the bottom plate of the additional capacitor 106 to either the analog input signal $V_{IN}$ or the negative reference voltage $-V_R$; a comparator 130 for comparing a voltage $V_X$ of the common circuit node 121 with the ground potential and outputting a binary decision Q; and a SAR logic 140 for receiving the binary decision Q and outputting the sampling signal SAMP and a plurality of control bits to control SPTT 111, 112, ..., 115 and SPDT 116.

Every SPTT receives a respective control bit $b_n$, for n=N−1, N−2, ..., 0. For instance, SPTT 111 receives $b_{N-1}$, SPTT 113 receives $b_2$, and SPTT 115 receives $b_0$. For each SPTT, the bottom plate of the corresponding capacitor will be connected to the analog input signal $V_{IN}$ if the sampling signal SAMP is asserted, will be connected to the positive reference voltage $V_R$ if the sampling signal SAMP is not asserted and the corresponding control bit is 1, and will be connected to the negative reference voltage $-V_R$ if the sampling signal SAMP is not asserted and the corresponding control bit is 0. For instance, the bottom plate of capacitor 102 will be connected to the analog input signal $V_{IN}$ if the sampling signal SAMP is asserted, will be connected to the positive reference voltage $V_R$ if the sampling signal SAMP is not asserted and $b_{N-2}$ is 1, and will be connected to the negative reference voltage $-V_R$ if the sampling signal SAMP is not asserted and $b_{N-2}$ is 0. For SPDT 116, the bottom plate of capacitor 106 will be connected to the analog input signal $V_{IN}$ if the sampling signal SAMP is asserted, otherwise it will be connected to the negative reference voltage $-V_R$.

In performing an analog-to-digital conversion, the SAR logic 140 first asserts the sampling signal SAMP to connect the bottom plates of all capacitors (i.e., 101, 102, ..., 106) to the analog input signal $V_{IN}$ and connect the top plates of all capacitors to the ground node to effectively sample the analog input signal $V_{IN}$ onto all of the capacitors. Then it de-asserts the sampling signal SAMP and commences a process of successive approximation to determine optimum values for all control bits $b_n$ to make the voltage $V_X$ progressively approach the ground potential. The successive approximation is an iteration process, starting from resolving the MSB (most significant bit) $b_{N-1}$ and ending at resolving the LSB (least significant bit) $b_0$. The initial value is 0 for all control bits. When resolving bit $b_n$ in a present iteration, the SAR logic 140 first set $b_n$ to 1, then it waits for the comparator 130 to output the binary decision Q. If the binary decision Q is 1, it lets $b_n$ stay at 1 and it moves on to the next iteration to resolve the next bit $b_{n-1}$; otherwise, it toggles $b_n$ to 0 and moves on to the next iteration to resolve the next bit $b_{n-1}$. Once all iterations are done, the SAR logic 140 outputs the final values of the control bits $b_n$ as the digital output data D.

In the illustrated prior art ADC 100, the capacitances $C_0$, $C_1$, $C_2$, ..., $C_{N-1}$ are chosen to form a sequence of power of two, i.e. $C_n=2^n C_0$, therefore the weights of the respective control bit $b_n$ also form a sequence of power of two. Prior art ADC 100 is vulnerable to dynamic errors due to factors such as: incomplete settling of $V_X$ during an iteration, thermal noise, and so on. Once an incorrect resolution on $b_n$ has been made in a present iteration, it moves on to the next iteration to resolve less significant bits and there is no chance to correct the error made in the preset iteration.

Liu et al disclose a method (in "A 12-bit, 45-MS/s, 3-mW Redundant Successive-Approximation-Register Analog-to-Digital Converter With Digital Calibration," IEEE Journal of Solid-State Circuits, VOL. 46. NO. 11, November 2011, pages 2661-2672) to make an incorrect resolution made in a present iteration correctable by later iterations by using a sub-radix-2 DAC, wherein the capacitors are scaled by a factor less than two. The method disclosed by Liu also facilitates the conversion speed by assisting the comparator to resolve the comparison faster by introducing a dynamic threshold. The details are not explained here, and interested readers are recommended to directly read the cited paper to acquire a thorough understanding. A drawback of the disclosed method is that it needs a few extra capacitors and also it needs more elaborate processing. In addition, Liu also proposes a background calibration method to calibrate an error in the digital output data D due to mismatch in the capacitances. However, elaborate or extensive processing is needed for the calibration.

What is disclosed in this application is a method for allowing the SAR ADC to correct an incorrect resolution made in a previous iteration and also facilitating the conversion without requiring extra capacitors or elaborate processing.

Also disclosed is a method to calibrate the SAR ADC.

SUMMARY

In an embodiment, a SAR (successive-approximation register) ADC (analog-to-digital converter) comprises: a plurality of capacitors, each comprising a top plate and a bottom plate, wherein all top plates of the capacitors are tied together to a common node; a switch controlled by a sampling signal for connecting the common node to a ground node when the sampling signal is asserted; a plurality of switching networks, each switching network associated with a respective capacitor of the plurality of capacitors and controlled by the sampling signal and a plurality of control bits comprising a respective grounding bit and a respective data bit, each of the plurality of switching networks for connecting the bottom plate of the respective capacitor to an analog input signal if the sampling signal is asserted, or else to the ground node if the respective grounding bit is asserted, or else to a first reference voltage if the respective data bit is one, or else to a second reference voltage; a comparator for detecting a polarity of the voltage at the common node and outputting a binary decision along with a complementary binary decision when a comparing signal is asserted; a logic gate for receiving the binary decision and the complementary binary decision and outputting a ready signal indicating whether a decision is readily made; a timer for receiving the comparing signal and outputting a time out signal; and a SAR logic for receiving the binary decision, the ready signal, and the time out signal and outputting the sampling signal, the comparing signal, the plurality of control bits, and an output data.

The SAR logic first enters a sampling state to cause the analog input signal to be sampled into said capacitors by asserting the sampling signal. The SAR logic also asserts all the grounding bits and set all the data bits to zero for all of said switching networks. The SAR logic then de-asserts the sampling signal, initializes an internal variable to an integer associated with a total count of said capacitors, and takes an iteration process comprising a plurality of iterations to progressively de-assert the grounding bits and determine the data bits for said switching networks so as to progressively reduce a magnitude of the voltage at the common node. Each iteration of said iterations comprises a compare state for asserting the comparing signal to command the comparator to output the binary decision indicating the polarity of the voltage at the common node. Each iteration of said iterations further comprises a wait state for waiting for the ready signal and the time out signal, whichever comes first. If the ready signal comes first, the binary decision is assigned to the data bit for the switching network indexed by the internal variable, or else a value independent of the binary decision is assigned to the data bit for the switching network indexed by the internal variable.

Each iteration of said iterations further conditionally comprises an update voltage state if the internal variable has not yet reached a lower bound. During the update voltage state: the voltage at the common node is updated in accordance with the binary decision of the switching network indexed by the internal variable; the internal variable is decremented; and then the SAR logic proceeds to a next iteration. If the internal variable has reached the lower bound, the SAR logic generates the output data using a weighted sum of data bits for said switching networks. In an embodiment, the respective capacitances of said capacitors form a geometric sequence with a common ratio greater than one but less than two. In an embodiment, the respective capacitances of said capacitors form a sequence wherein: every term except the first term in the sequence is less than the first term plus a sum of all terms preceding this term.

In an embodiment, a method of analog-to-digital conversion comprises the following steps: (a) sampling an analog input signal into a plurality of capacitors; (b) initializing an internal variable to an upper bound associated with a total count of the plurality of capacitors; (c) commanding a comparator to start a comparison to detect a polarity of a voltage associated with the plurality of capacitors and setting off a timer to set an upper limit on the time the comparison may take; (d) setting a data bit indexed by the internal variable to a result of the comparison if the comparison is finished before a time set by the timer expires, else setting the data bit indexed by the internal variable to either 1 (one) or 0 (zero) independent of the result of the comparison; (e) adjusting the voltage associated with the plurality of capacitors in accordance with the data bit indexed by the internal variable; (f) decrementing the internal variable; and then (g) returning to step (c) if the internal variable has not yet reached a lower bound, else outputting an output data based on a weighted sum of all data bits set in step (d) and returning to step (a). Each of said capacitors comprises a top plate and a bottom plate and all top plates of said capacitors are tied together to a common node.

In step (a), the common node is connected to a ground node and all bottom plates of said capacitors are connected to the analog input signal. In step (b), the common mode is disconnected from the ground node and all bottom plates of said capacitors are connected to the ground node. In step (c), the comparator detects the polarity of the voltage at the common node; the comparator outputs the binary decision along with a complementary binary decision; both the binary decision and the complementary decision are preset to 1 (one) when the comparison starts; and the comparison is finished if either the binary decision or the complementary binary decision toggles to 0 (zero). In an embodiment, step (d) further comprises: if the comparison is not finished before the time set by the timer expires, setting the data bit indexed by the internal variable to a default value. In step (e), adjusting the voltage associated with said capacitors in accordance with the data bit indexed by the internal variable comprises: connecting the bottom plate of the capacitor indexed by the internal variable to either a first reference voltage or a second reference voltage depending on the value of the data bit indexed by the internal variable.

In an embodiment, the respective capacitances of said capacitors form a geometric sequence with a common ratio greater than one but less than two. In an embodiment, the respective capacitances of said capacitors form a sequence wherein: every term except the first term in the sequence is less than the first term plus a sum of all terms preceding this term.

In an embodiment, a SAR (successive-approximation register) ADC (analog-to-digital converter) comprising: a plurality of capacitors, each comprising a top plate and a bottom plate, wherein all top plates of the plurality of capacitors are tied together to a common node; a switch for connecting the common node to a ground node when either a sampling signal or a reset signal is asserted; a plurality of switching networks, each associated with a respective capacitor of the plurality of capacitors and controlled by the sampling signal and a plurality of control bits comprising a respective grounding bit and a respective data bit, the plurality of switching networks for connecting the bottom plate of the respective capacitor to an analog input signal if the sampling signal is asserted, or else to the ground node if the respective grounding bit is asserted, or else to a first reference voltage if the respective data bit is 1 (one), or else to a second reference voltage; a comparator for detecting a polarity of the voltage at the common node and outputting a binary decision along with a complementary binary decision when a comparing signal is asserted; a logic gate for receiving the binary decision and the complementary binary decision and outputting a ready signal; a timer for receiving the comparing signal and outputting a time out signal; and a SAR logic for receiving the binary decision, the ready signal, and the time out signal and outputting the sampling signal, the reset signal, the control bits, and an output data, wherein the SAR logic operates either in a calibration mode where the sampling signal is never asserted or in a normal operation mode where the reset signal is never asserted.

In the calibration mode, the SAR logic first enters a reset state where the reset signal is asserted, the comparing signal is de-asserted, and all grounding signals are asserted, effectively clearing off charges on said capacitors. The SAR logic then enters an inject state where the reset signal is de-asserted, all data bits are set to 0 (zero) except that the data bit corresponding to a capacitor under calibration is set to 1 (one), the grounding bit corresponding to the capacitor under calibration and all grounding bits corresponding to capacitors of less weight than the capacitor under calibration are set to 0 (zero). The SAR logic then initializes an internal variable to an integer associated with an index of the capacitor under calibration, and takes an iteration process comprising a plurality of iterations to successively update the data bits for capacitors of less weight than the capacitor under calibration so as to minimize a magnitude of the voltage at the common node.

Each iteration of said iterations comprises a compare state for asserting the comparing signal to command the comparator to output the binary decision indicating the polarity of the voltage at the common node. Each iteration of said iterations further comprises a wait state for waiting for the ready signal and the time out signal, whichever comes first. If the ready signal comes first, the binary decision is assigned to the data bit for the capacitor indexed by the internal variable, or else a value independent of the binary decision is assigned to the data bit for the capacitor indexed by the internal variable. Each iteration of said iterations further conditionally comprises an update voltage state if the internal variable has not yet reached a lower bound. During the update voltage state: the voltage at the common node is updated in accordance with the binary decision of the switching network indexed by the internal variable; the internal variable is decremented; and then the SAR logic proceeds to a next iteration. If the internal variable has reached the lower bound, the SAR logic generate a calibrated weight for the capacitor under calibration using a weighted sum of data bits for capacitors of less weight than the capacitor under calibration.

In an embodiment, the respective capacitances of said capacitors form a geometric sequence with a common ratio greater than one but less than two. In an embodiment, the respective capacitances of said capacitors form a sequence wherein: every term except the first term in the sequence is less than the first term plus a sum of all terms preceding this term.

A method of calibrating an analog-to-digital converter comprising the following steps: (a) clearing off charges on a plurality of capacitors, wherein each capacitor is associated with a respective index; (b) establishing an initial charge on said capacitors by an amount representing a weight of a capacitor under calibration; (c) initializing an internal variable to the index associated with the capacitor under calibration; (d) commanding a comparator to start a comparison to detect a polarity of a voltage associated with said capacitors and setting off a timer to set an upper limit on the time the comparison may take; (e) setting a data bit associated with the capacitor indexed by the internal variable to a result of the comparison if the comparison is finished before a time set by the timer expires, else setting the data bit associated with the capacitor indexed by the internal variable to either 1 (one) or 0 (zero) without using the result of the comparison; (f) adjusting the voltage associated with said capacitors in accordance with the data bit associated with the capacitor indexed by the internal variable; (g) decrementing the internal variable; and then (h) returning to step (d) if the internal variable has not yet reached a lower bound, else determining a calibrated weight for the capacitor under calibration based on a weighted sum of all data bits set in step (e). Each capacitor of said capacitors comprises a top plate and a bottom plate; all top plates of said capacitors are tied together to a common node.

In step (a) the common node is connected to a ground node and all bottom plates of said capacitors are connected to the ground node. In step (b): the common node is disconnected from the ground node; the bottom plate of the capacitor under calibration is connected to a first reference voltage; the bottom plate of every capacitor among said capacitors of more weight than the capacitor under calibration is connected to the ground node; and the bottom plate of every capacitor among said capacitors of less weight than the capacitor under calibration is connected to a second reference voltage. In step (d) the comparator detects the polarity of the voltage at the common node; the comparator outputs the binary decision along with a complementary binary decision; both the binary decision and the complementary decision are preset to 1 when the comparison starts; and the comparison is finished if either the binary decision or the complementary binary decision toggles to 0 (zero). In an embodiment, step (e) further comprises: if the comparison is not finished before the time set by the timer expires, setting the data bit associated with the capacitor indexed by the internal variable to a default value. In step (f), adjusting the voltage associated with said capacitors in accordance with the data bit indexed by the internal variable comprises: connecting the bottom plate of the capacitor indexed by the internal variable to either a first reference voltage or a second reference voltage depending on the value of the data bit associated with the capacitor indexed by the internal variable.

In an embodiment, the respective capacitances of said capacitors form a geometric sequence with a common ratio greater than one but less than two. In an embodiment, the respective capacitances of said capacitors form a sequence wherein: every term except the first term in the sequence is less than the first term plus a sum of all terms preceding this term.

DETAILED DESCRIPTION

Figure 1:
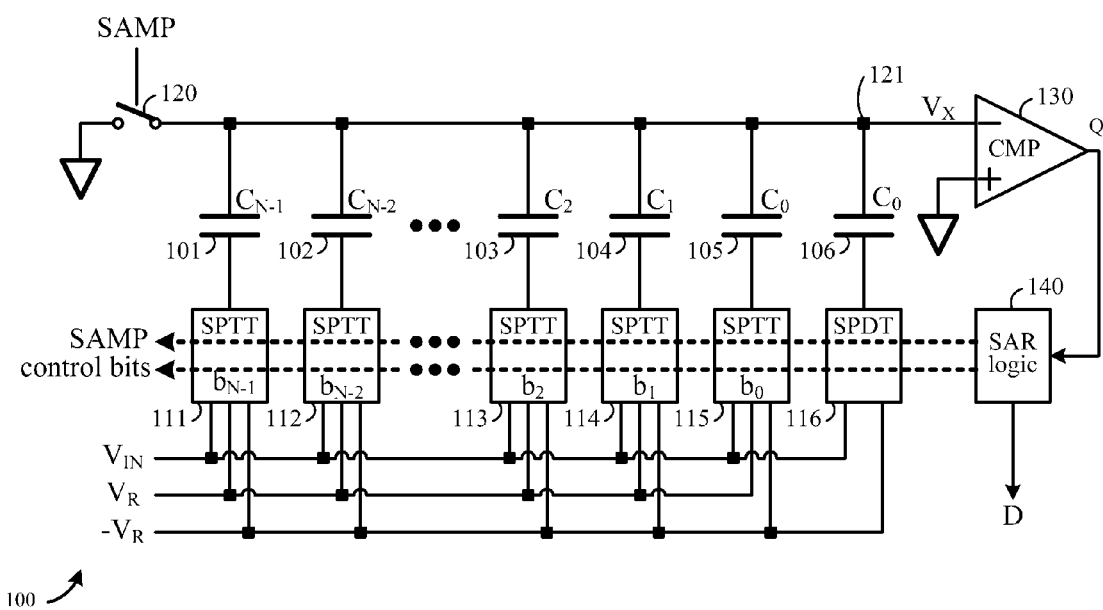
FIG. 1 shows a schematic diagram of a prior art SAR ADC

The following detailed description refers to the accompanying drawings which show, by way of illustration, various embodiments in which the invention may be practiced. These embodiments are described in sufficient detail to enable those skilled in the art to practice these and other embodiments. The various embodiments are not necessarily mutually exclusive, as some embodiments can be combined with one or more other embodiments to form new embodiments. The following detailed description is, therefore, not to be taken in a limiting sense.

A schematic diagram of a SAR ADC 200 in accordance with an embodiment of the present invention is depicted in FIG. 2. ADC 200 converts an analog input signal $V_{IN}$ into a digital output data D and comprises: N capacitors 201, 202, . . . , 205 having capacitance $C_{N-1}$, $C_{N-2}$, . . . , $C_0$, respectively, wherein N is an integer greater than one and all top plates of the N capacitors 201, 202, . . . , 205 are electrically connected to a common circuit node 221 with a voltage denoted as $V_X$; a switch 220 for connecting the common circuit node 221 to a ground node when a logical signal SAMP (referred to as the sampling signal) is asserted; N single-pole-quadruple-throw (SPQT) switches 211, 212, . . . , 215 for respectively connecting the bottom plates of the N capacitors 201, 202, . . . , 205 to one of the analog input signal $V_{IN}$, the ground node, a positive reference voltage $V_R$, and a negative reference voltage $-V_R$; a comparator 230 for comparing $V_X$ with the ground potential and outputting a binary decision Q along with a complementary binary decision QB when a logical signal COMP (referred to as the comparing signal) is asserted; a XOR gate 260 for receiving Q and QB and outputting a logical signal RDY (referred to as the ready signal); a timer 250 for receiving COMP and outputting a logical signal TO (referred to as the time out signal); and a SAR logic 240 for receiving the binary decision Q, the ready signal RDY, and the time out signal TO and outputting the sampling signal SAMP, the comparing signal COMP, and a plurality of control bits denoted as $z_n$ and $b_n$ to control SPQT 211, 212, . . . , 215. Every SPQT receives a respective grounding bit $z_n$ and a respective data bit $b_n$, for n=N−1, N−2, . . . , 0. For instance, SPQT 211 receives $z_{N-1}$ and $b_{N-1}$, SPQT 213 receives $z_2$ and $b_2$, and SPQT 215 receives $z_0$ and $b_0$.

For each SPQT: the bottom plate of the corresponding capacitor will be connected to the analog input signal $V_{IN}$ if the sampling signal SAMP is asserted; it will be connected to the ground node if the sampling signal SAMP is de-asserted but the corresponding grounding bit is 1; it will be connected to the positive reference voltage $V_R$ if the sampling signal SAMP is de-asserted, the corresponding grounding bit is 0, and the corresponding data bit is 1; and it will be connected to the negative reference voltage $-V_R$ if the sampling signal SAMP is de-asserted, the corresponding grounding bit is 0, and the corresponding data bit is 0. For instance, the bottom plate of capacitor 202 will be connected to the analog input signal $V_{IN}$ if the sampling signal SAMP is asserted; it will be grounded if the sampling signal SAMP is de-asserted and $z_{N-2}$ is 1; it will be connected to the positive reference voltage $V_R$ if the sampling signal SAMP is de-asserted, $z_{N-2}$ is 0, and $b_{N-2}$ is 1; and it will be connected to the negative reference voltage $-V_R$ if the sampling signal SAMP is de-asserted, $z_{N-2}$ is 0, and $b_{N-2}$ is 0.

In performing an analog-to-digital conversion, the SAR logic 240 first asserts the sampling signal SAMP to connect the bottom plates of all capacitors (i.e., 201, 202, . . . , 205) to the analog input signal $V_{IN}$ and connect the top plates of all capacitors to the ground node to effectively sample the analog input signal $V_{IN}$ onto all capacitors. Then it de-asserts the sampling signal SAMP, asserts all grounding bits $z_n$, and commences a process of successive approximation to successively determine values for all data bits $b_n$ to make the voltage $V_X$ progressively approach the ground potential. The successive approximation is an iteration process comprising N iterations steps, starting from resolving the MSB (most significant bit) $b_{N-1}$ and ending at resolving the LSB (least significant bit) $b_0$. In the $i^{th}$ iteration, $b_{N-i}$ is being resolved. For instance, in the 1$^{st}$ iteration, $b_{N-1}$ is being resolved; in the 2$^{nd}$ iteration, $b_{N-2}$ is being resolved; and so on. When resolving data bit $b_{N-i}$ in the $i^{th}$ iteration, the SAR logic 240 goes through the following steps: first, asserts the comparing signal COMP to command the comparator 230 to perform a comparison to decide whether $V_X$ is above or below the ground potential; waits for assertion of the time-out signal TO from timer 250 or assertion of the ready signal RDY from the XOR gate 260, whichever comes first; if the ready signal RDY is asserted first, it latches the value of the binary decision Q, de-asserts the comparing signal COMP, sets $b_{N-i}$ to Q, sets $z_{N-i}$ to 0, and moves on to the next iteration to resolve the next bit $b_{N-i-1}$; if the time out signal TO is asserted first, it de-asserts the comparing signal COMP, ignores the binary decision Q and assigns on its own a binary value to $b_{N-i}$, sets $z_{N-i}$ to 0, and moves on to the next iteration to resolve the next bit $b_{N-i-1}$. After the $N^{th}$ iteration is finished, $b_0$ is resolved and $z_0$ is set to 0, the SAR logic 240 asserts the comparing signal COMP to command the comparator 230 to perform a final comparison; then it waits for assertion of the time-out signal TO from timer 250 or assertion of the ready signal RDY from the XOR gate 260, whichever comes first; if the ready signal RDY is asserted first, it latches the value of the binary decision Q, de-asserts the comparing signal COMP, sets an additional data bit $b_{-1}$ to Q; if the time signal TO is asserted first, it de-asserts the comparing signal COMP, ignores Q and assigns on its own a binary value to $b_{-1}$. At this point, the present analog-to-digital conversion is finished and the SAR logic 240 performs a weighted sum to output the digital output data D in accordance with the following equation:

$$D = \sum_{n=0}^{N-1} b_n W_n + b_{-1} \qquad (1)$$

where $$W_n = C_n / C_0 \qquad (2)$$

In a preferred but not limiting embodiment, the capacitances $C_0, C_1, C_2, \ldots, C_{N-1}$ form a sub-radix-2 capacitor array where:

$$1 < C_n / C_{n-1} < 2, \text{ for } n=1,2,3,\ldots,N-1 \qquad (3)$$

and $$C_n < C_0 + \sum_{m=0}^{n-1} C_m, \text{ for } n=1,2,3,\ldots,N-1 \qquad (4)$$

Therefore, $$W_n < 1 + \sum_{m=0}^{n-1} W_m, \text{ for } n=1,2,3,\ldots,N-1 \qquad (5)$$

That is, a weight of the bit to be resolved in an ongoing iteration is less than a summation of the weights of all the bits remaining to be resolved in later iterations. Assume SAR ADC is resolving $b_n$ in the ongoing iteration. It is convenient to define a critical voltage for this iteration as:

$$V_{n,critical} \equiv V_R (C_0 + \sum_{m=0}^{n-1} C_m - C_n) / \sum_{k=0}^{N-1} C_k \qquad (6)$$

Consider a scenario where in the present iteration $V_X$ is below $-V_{n,critical}$; in this scenario, the present data bit $b_n$ must be resolved as 1; if for some reason (e.g., noise) $b_n$ is wrongly resolved as 0, the resultant $V_X$ after applying $b_n=0$ and $z_n=0$ would be below $-V_R (C_0 + \sum_{m=0}^{n-1} C_m) / \sum_{k=0}^{N-1} C_k$ and is lower than the lower limit of what the remaining iterations can resolve; in this case, this wrong resolution is a catastrophic error. Consider another scenario where in the present iteration $V_X$ is above $V_{n,critical}$; in this scenario, the present data bit $b_n$ must be resolved as 0; if for some reason (e.g., noise) $b_n$ is incorrectly resolved as 1 the resultant $V_X$ after applying $b_n=1$ and $z_n=0$ would be above $V_R (C_0 + \sum_{m=0}^{n-1} C_m) / \sum_{k=0}^{N-1} C_k$ and is higher than the upper limit of what the remaining iterations can resolve; in this case, this incorrect resolution is also a catastrophic error.

Now consider the scenario where in the present iteration $V_X$ is below $V_{n,critical}$ but above $-V_{n,critical}$; in this scenario, even if the present data bit $b_n$ is incorrectly resolved, the resultant $V_X$ after applying the wrong resolution for $b_n$ and $z_n=0$ is still within the range where the remaining iterations can resolve; in this case, the resolution of $b_n$ is indeed irrelevant, since the remaining iterations can still make $V_X$ progressively approach ground potential regardless of whether $b_n=0$ or $b_n=1$. In other words, there exists a "gray area" (between $-V_{n,critical}$ and $V_{n,critical}$) where an incorrect resolution can be tolerated. Also note that, when $V_X$ is outside the "gray area," an incorrect resolution cannot be tolerated but it is highly unlikely for the wrong resolution to happen in the first place since in this case $V_X$ is far different from the ground potential and it would take a very serious impairment for the comparator to make an incorrect resolution.

In an embodiment of a special case, capacitances $C_0$, $C_1$, $C_2$, $C_3$, ..., $C_{N-1}$ form a geometric sequence with a common ratio greater than one but less than two. It is obvious that equations (3) and (4) hold in this special case.

In certain embodiments of the present invention, every time the comparator 230 is performing a comparison, the ground potential is always at the center of the "gray area." This means the range of error tolerance is fully utilized. Therefore, the method disclosed in this present invention is superior to that disclosed in the aforementioned paper by Liu et al where a plurality of extra capacitors are needed to implement a dynamic threshold to ensure the range of error tolerance is fully utilized.

When the comparator 230 receives the sampling command COMP to commence a comparison between $V_X$ and the ground potential, it presets both Q and QB to 1. When the comparison is finished, either Q or QB will change to 0; if Q changes to 0, it indicates $V_X$ is higher than the ground potential; if QB changes to 0, it indicates $V_X$ is lower than the ground potential; in either case, the ready signal RDY will be asserted due to the XOR gate 260. The time needed for comparator 230 to finish the comparison depends on a magnitude of the difference between $V_X$ and the ground node; if the difference is large, it takes a short time to finish the comparison; if the difference is small, it takes a long time to finish the comparison. Worse yet, if the difference is zero, it theoretically takes forever to finish the comparison; this is often referred to as "meta-stability," which greatly hinders the speed and the function of the ADC.

In embodiments of this present invention, however, if $V_X$ is very close to the ground potential, $V_X$ must be in the "gray area," wherein the result of the comparison is in fact irrelevant. To take advantage of this property, whenever SAR logic 240 asserts the comparing signal COMP to command the comparator 230 to perform the comparison (between $V_X$ and the ground potential), the timer 250 is started. If the ready signal RDY does not go high before the timer expires, the time out signal TO will be asserted, suggesting $V_X$ must be in the "gray area"; in this case, the SAR logic 240 will de-assert the COMP signal to command the comparator 230 to abort the present comparison. Since $V_X$ is in the gray area, the SAR logic 240 can arbitrarily set the value of the present data bit, say $b_n$, under resolving. In a first embodiment, $b_n$ remains 0 if the time out occurs. In a second embodiment, $b_n$ is set to 1 if the time out occurs. In a third embodiment, $b_n$ is set according to a pseudo-random number generator if the time out occurs. In a fourth embodiment, $b_n$ is set to be the same as the previous bit $b_{n+1}$, if applicable. In a fifth embodiment, $b_n$ is set to be the logical inversion of the previous bit $b_{n+1}$, if applicable. By using the time-out feature, the time taken to finish each iteration is well constrained, avoiding the meta-stability and thus allowing a high-speed conversion.

Figure 2A:
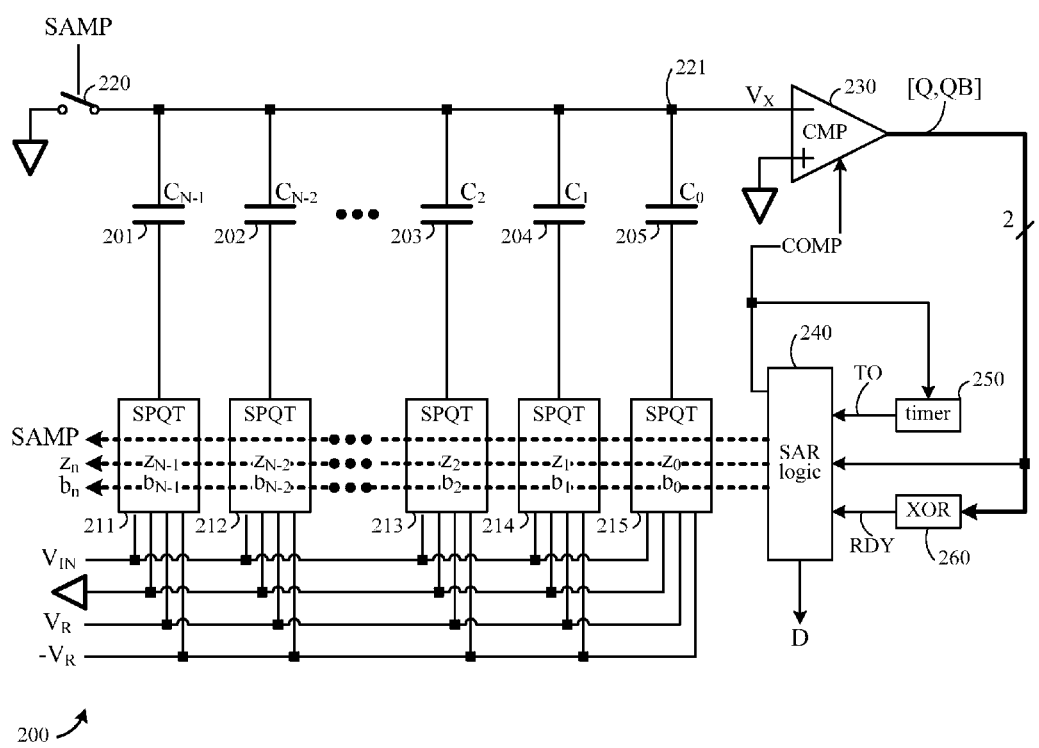
FIG. 2A shows a schematic diagram of a SAR ADC in accordance with an embodiment of the present invention.
Figure 3:
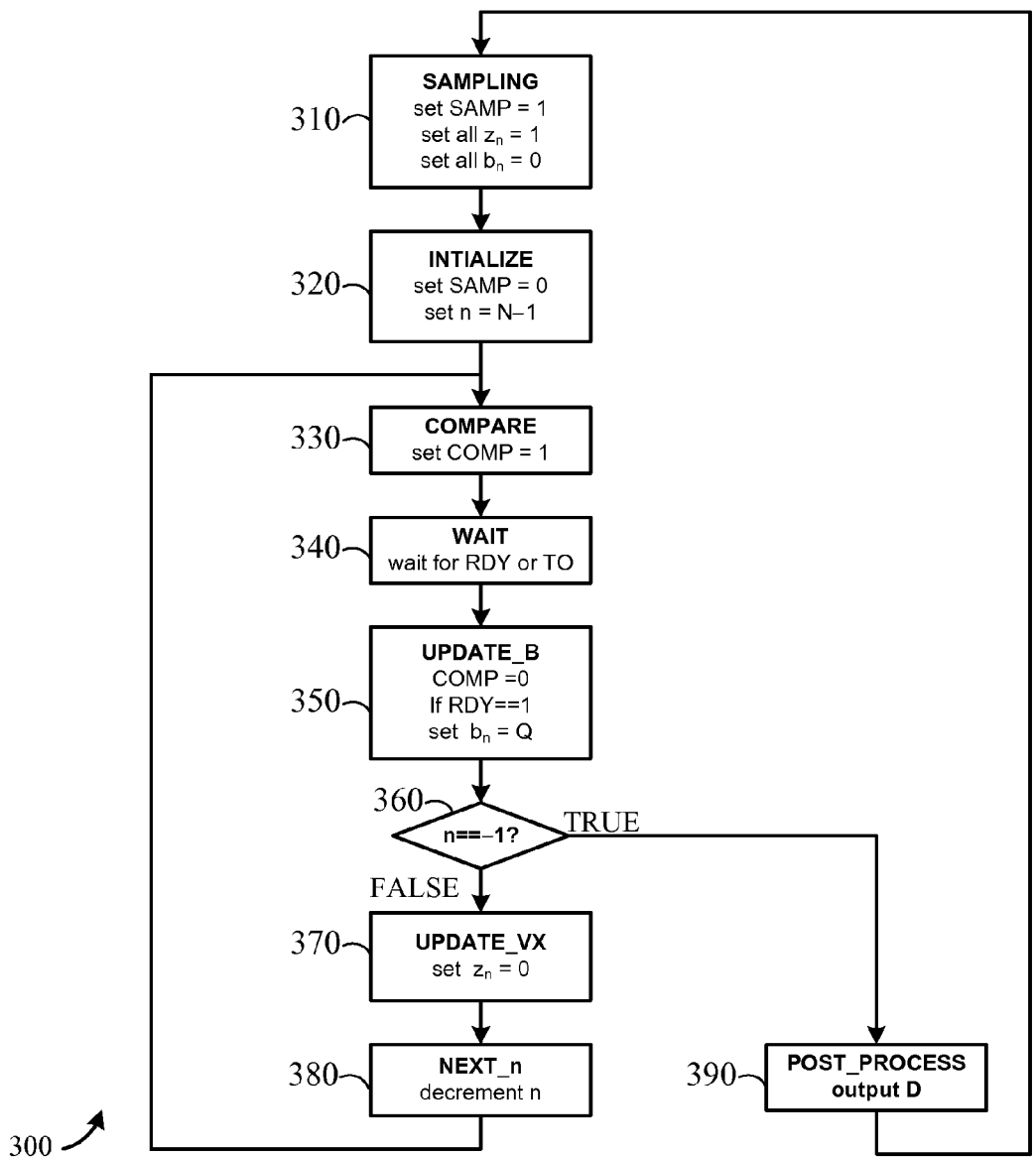
FIG. 3 shows an algorithm of the SAR ADC of FIG. 2A.

A flow chart 300 is depicted in FIG. 3 to illustrate an algorithm of SAR ADC 200 of FIG. 2A modeled as a finite state machine. It starts with the SAMPLING state 310, wherein the sampling signal SAMP is asserted, all $z_n$ (for n=0, 1, 2, ..., N-1) are set to 1 and all $b_n$ (for n=-1, 0, 1, 2, ..., N-1) are set to 0. Then it enters the INITIALIZE state 320, wherein the sampling signal SAMP is de-asserted, and the internal variable n is set to N-1. Then it enters the COMPARE state 330, wherein the comparing signal COMP is asserted. Then it enters the WAIT state 340, wherein it waits for assertion of the ready signal RDY or the time out signal TO, whichever comes first. Then it enters the UPDATE_B state 350, wherein the binary decision Q is latched, the comparing signal COMP is de-asserted, and $b_n$ is set to the latched value of Q if the ready signal RDY is asserted. Then it checks if the internal variable n is -1. If n is not -1, it enters the UPDATE_VX state 370, wherein $z_n$ is set to 0; then it enters the NEXT_n state, wherein the internal variable n is decremented by 1; then it loops back to the COMPARE state 330. If n is -1, it enters the POST_PROCESS state 390, wherein the digital output data D is calculated using equation (1); then it loops back the SAMPLING state 310 to perform next analog-to-digital conversion.

As stated above, the digital output data D is calculated using equation (1) based on the respective weight $W_n$, which is derived from equation (2). In reality, one may only know the nominal values having capacitance ratios $C_n/C_0$ (for n=1, 2, ..., N-1), and the exact values may deviate from the nominal values due to limited tolerance of the capacitors 201, 202, ..., 205 in the manufacturing process. When the exact values of the capacitance ratios deviate from the nominal values, using the nominal values to calculate the digital output data D may result in inaccurate results. This problem can be alleviated by performing a foreground calibration to acquire a good estimate on the exact value of the weight $W_n$.

Figure 2B:
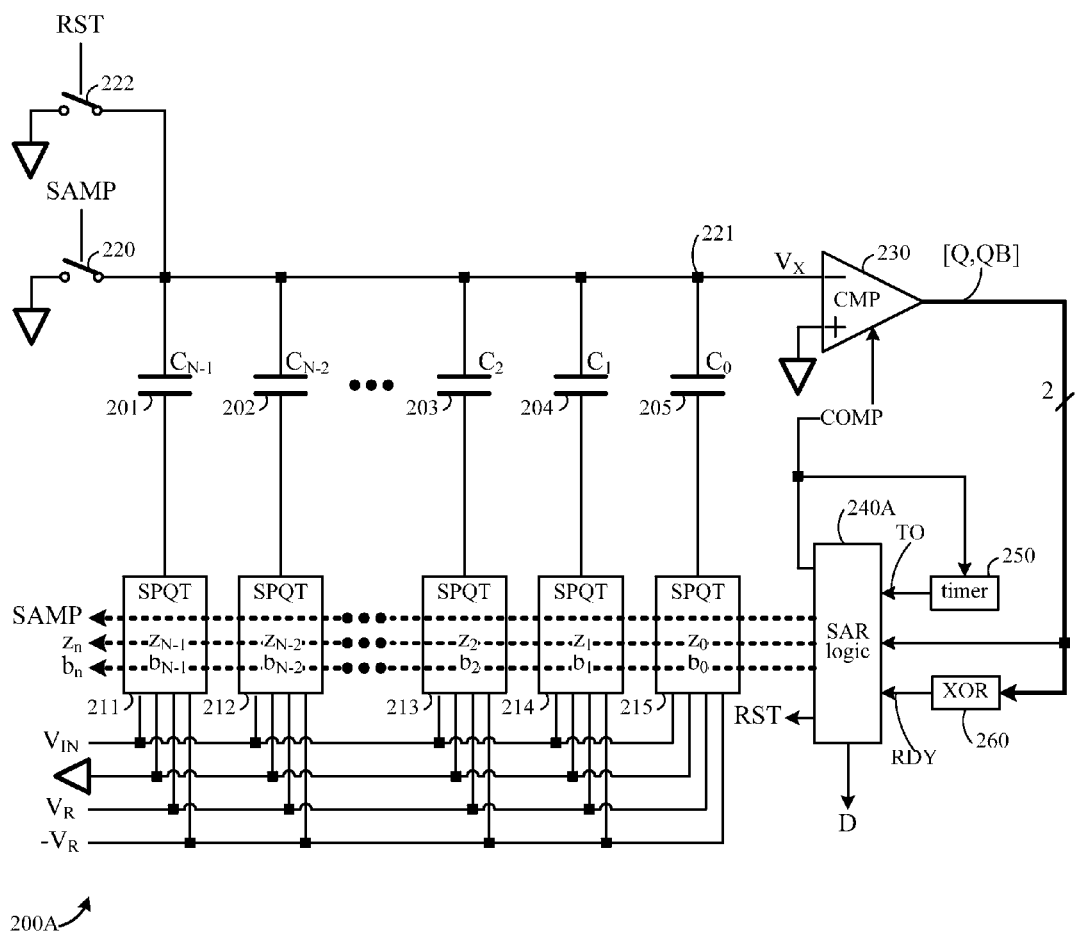
FIG. 2B shows a schematic diagram of a SAR ADC with calibration in accordance with an embodiment of the present invention.

A schematic diagram of SAR ADC 200A with capability of foreground calibration in accordance with an embodiment of the present invention is depicted in FIG. 2B. ADC 200A of FIG. 2B is same as ADC 200 of FIG. 2A except for the following changes: an additional switch 222 is employed to connect the common circuit node 221 to the ground node when a reset signal RST is asserted; the SAR logic 240A and the algorithm therein are different from SAR logic 240 of FIG. 2A. SAR ADC 200A operates either in a normal mode or a calibration mode. When operating in the normal mode, the reset signal RST is never asserted and SAR 200A of FIG. 2B functions exactly the same as SAR 200 of FIG. 2A. When operating in the calibration mode, the sampling signal SAMP is never asserted and SAR 200A of FIG. 2B disregards the analog input signal $V_{IN}$ and generates input on its own.

Figure 4:
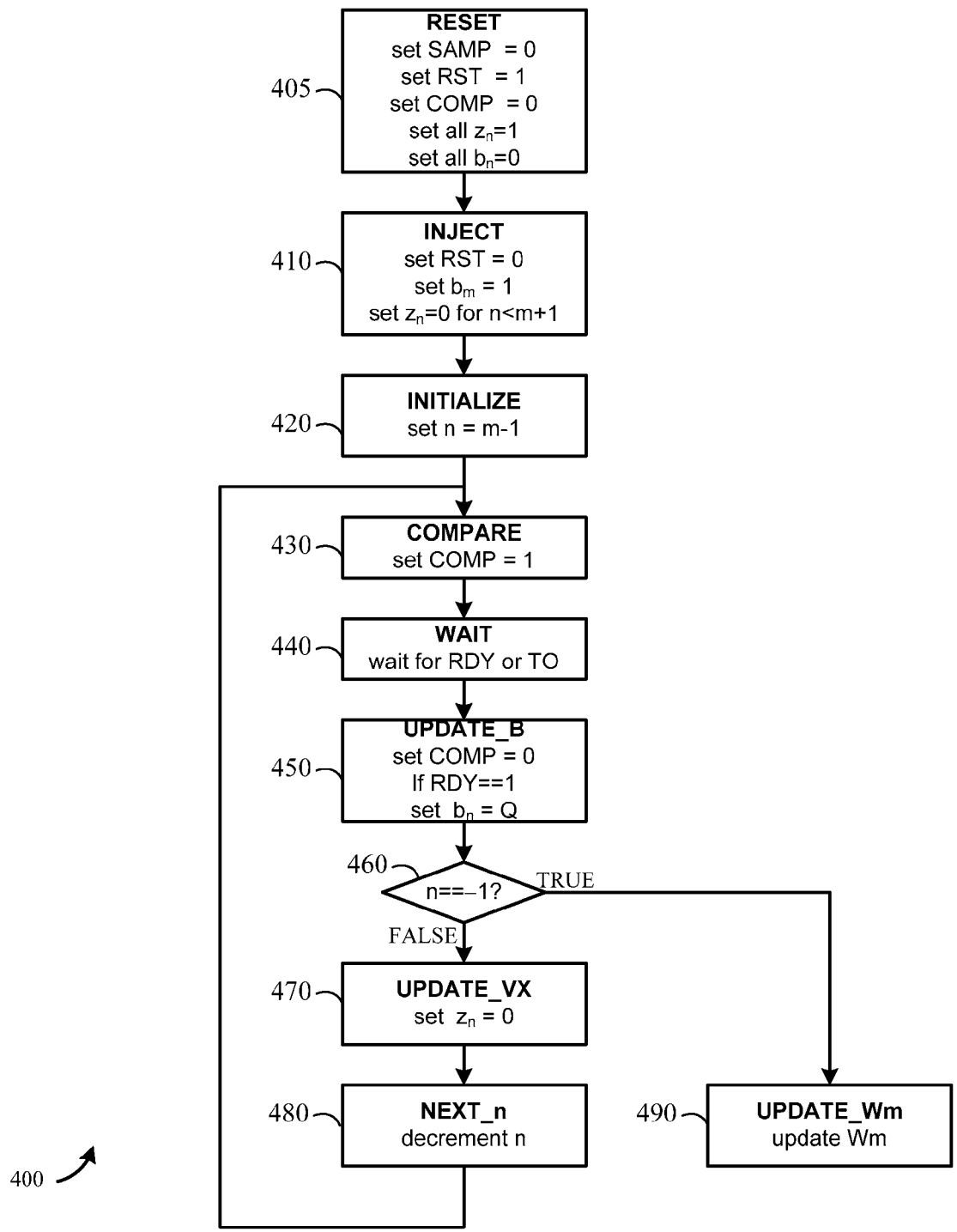
FIG. 4 shows an algorithm of calibrating the SAR ADC of FIG. 2B.

An algorithm 400 of operating in a calibration mode in accordance with the present invention for calibrating the weight $W_m$ (which is the ratio $C_m/C_0$, where 0<m<N) for ADC 200A of FIG. 2B is shown in FIG. 4. It starts with the RESET state 405, wherein the sampling signal SAMP is de-asserted, the reset signal RST is asserted, the comparing signal COMP is de-asserted, all $z_n$ are set to 1, and all $b_n$ are set to 0, effectively clearing off charges on capacitors 201, 201, ..., 205. Then it enters the state INJECT 410, wherein the reset signal RST is de-asserted, $b_m$ (i.e., the data bit corresponding to the weight $W_m$ to be calibrated) is set 1, and $z_n$ are set to 0 for n<m+1, effectively connecting the positive reference voltage $V_R$ to the capacitor corresponding to $b_m$, and the negative voltage $-V_R$ to capacitors of lower weights (than the capacitor corresponding to $b_m$) thus effectively resulting in sampling into the capacitors a test voltage representing the weight of $b_m$. Then it enters the INITIALIZE state 420, where the internal variable n is set to m-1. Then it enters the COMPARE state 430, wherein the comparing signal COMP is asserted. Then it enters the WAIT state 440, wherein it waits for assertion of the ready signal RDY signal or the time out signal TO, whichever comes first. Then it enters the UPDATE_B state 450, wherein the value of the binary decision Q is latched, the comparing signal COMP is de-asserted, and $b_n$ is set to the latched value of Q if the ready signal RDY is asserted. Then it checks if the internal variable n is −1. If n is not −1, it enters the UPDATE_VX state 470, wherein $z_n$ is set to 0; then it enters the NEXT_n state 480, wherein the internal variable n is decremented by 1; then it loops back to the COMPARE state 430. If n is −1, it enters the UPDATE_μm state 490, wherein $W_m$ is calculated using equation (7) below.

$$W_m = \Sigma_{m=0}^{n-1} b_n W_n + b_{-1} \qquad (7)$$

Note that the calibration is very similar to a normal ADC conversion, only that the input is not sampled from $V_{IN}$ but instead injected internally in state INJECT 410 that effectively makes the input signal equal to the weight of $b_m$.

Note that algorithm 400 is for calibrating $W_m$, where 0<m<N. One may choose whatever m one likes to calibrate. In calibrating $W_m$ using equation (7), one assumes $W_n$ for 0≤n≤m−1 are reliable and thus can be used to calibrate $W_m$. This assumption must be carefully examined at the discretion of the circuit designers. Besides, after $W_m$ is calibrated and thus becomes more reliable, $W_n$ for 0≤n≤m can be used to calibrate $W_{m+1}$ by going through the same process except that m is changed to m+1. In this manner, one can first calibrate $W_m$ for a small m, and incrementally calibrate $W_{m+1}$, $W_{m+2}$, and so on. In a further embodiment, the process of calibrating $W_m$ is repeated a plurality of times, each leading to a tentative value of $W_m$ based on equation (7), and an average of these tentative values is then assigned to $W_m$. This further embodiment is more reliable than simply applying the process once.

Although ADC 200 of FIG. 2A and ADC 200A of FIG. 2B are shown as single-ended circuits, they can be embodied as differential circuits. Those of ordinary skill in the art will appreciate how to convert a single-ended circuit into a differential circuit (basically, treat the single-ended circuit as one half of the differential circuit, and duplicate the single-ended circuit to form another half of the differential circuit), and therefore it is not explained in detail here. In a differential circuit embodiment, the input analog signal $V_{IN}$ comprises a first end $V_{IN+}$ and a second end $V_{IN-}$, the voltage $V_X$ comprises a first end $V_{IN}$ and a second end $V_{IN-}$, the ground node is replaced with a common-mode voltage node, and the comparator is comparing $V_{X+}$ with $V_{X-}$, instead of comparing the ground potential with $V_X$. In many literatures, it is a common practice to use a single-ended circuit topology to explain the principles of the circuit for brevity but use a differential circuit topology in actual implementation. (For instance, see the above cited paper by Liu et al.)

Figure 5:
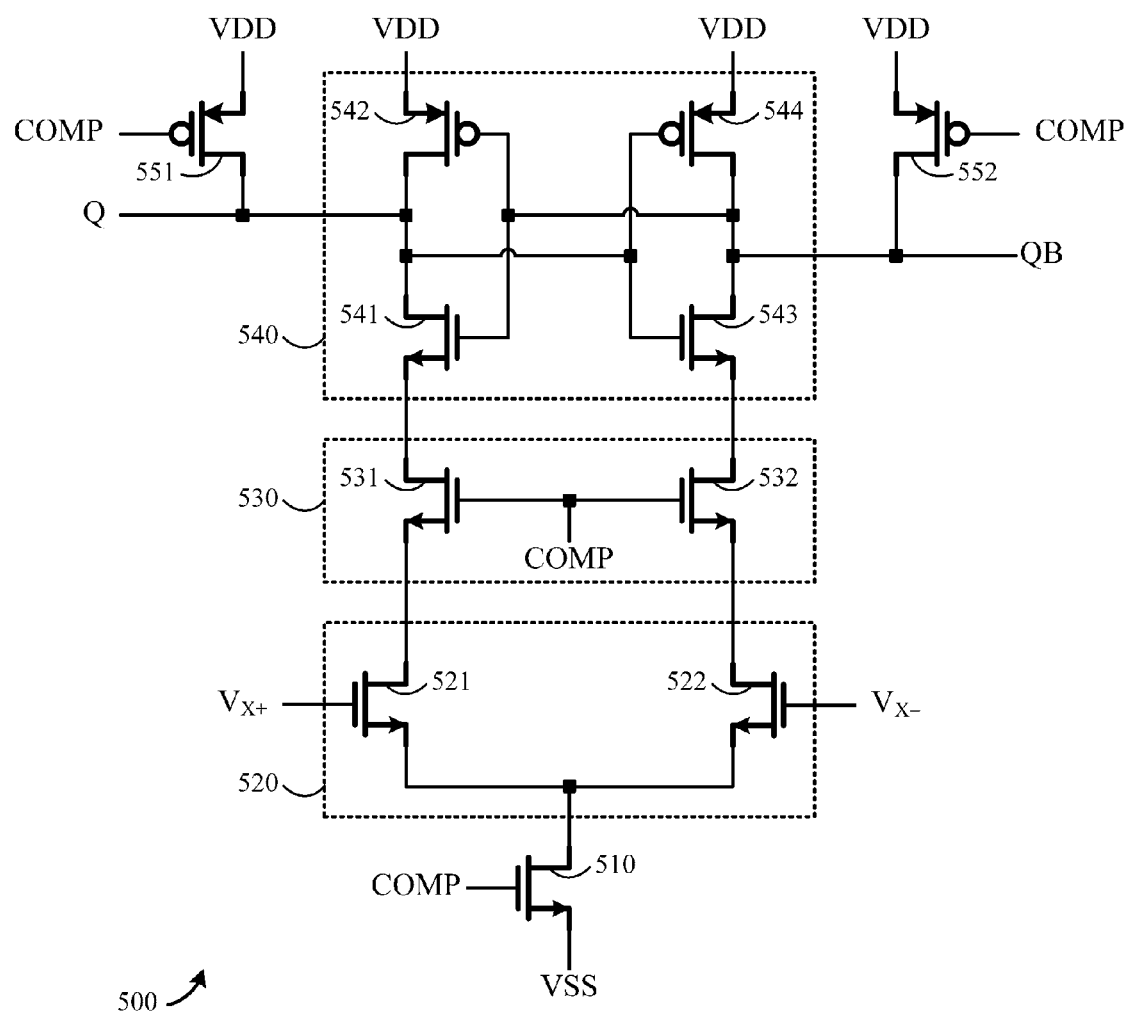
FIG. 5 shows a comparator suitable for use in the SAR ADC of FIG. 2A and the SAR ADC of FIG. 2B.

A schematic diagram of a comparator 500 suitable for use in a differential circuit embodiment of ADC 200 FIG. 2A and ADC 200A of FIG. 2B is shown in FIG. 5. Since it's a differential circuit embodiment, $V_{X+}$ is compared with $V_{X-}$ (instead of the ground potential being compared with $V_X$, since $V_X$ is embodied as $V_{X+}-V_{X-}$). Comparator 500 comprises: a differential pair 520 comprising NMOS (short for n-type metal oxide semiconductor field effect transistor) 521 and 522 for receiving the differential signal $V_{X+}-V_{X-}$; a bias NMOS 510 controlled by the comparing signal COMP for providing a tail current to the differential pair 520; a switch pair 530 comprising NMOS 531 and NMOS 532 controlled by the comparing signal COMP for enabling an output of the differential pair 520; a latch 540 embodied by a crossed coupled pair of CMOS (short for complementary metal oxide semiconductor field effect transistor) inverters comprising a first CMOS inverter made up of NMOS 541 and PMOS (short for p-type metal oxide semiconductor field effect transistor) 542 and a second CMOS inverter made up of NMOS 543 and PMOS 544 for receiving the output of the differential pair 520 via the switch pair 530 and outputting the binary decision Q and the complementary binary decision QB; and a pair of pull-up PMOS 551 and 552 controlled by the comparing signal COMP. Here, VDD denotes a positive power supply node and VSS denotes a negative power supply node. When the comparing signal COMP is de-asserted: the tail current of the differential pair 520 is shut off (due to NMOS 510), the output of the differential pair 520 is disabled (due to switch pair 530), and both Q and QB are pulled high (due to PMOS 551 and 552). When the comparing signal COMP is asserted and $V_{X+}$ is higher than $V_{X-}$: NMOS 521 conducts more current than NMOS 522, causing Q to be pulled low and QB to be pulled high. When the comparing signal COMP is asserted and $V_{X+}$ is lower than $V_{X-}$: NMOS 522 conducts more current than NMOS 521, causing QB to be pulled low and Q to be pulled high.

In an alternative embodiment, the XOR gate 260 (in both FIG. 2A and FIG. 2B) is replaced with a NOR gate. Note that a NOR gate functions equivalently to a XOR gate when it is impossible for the two inputs (Q and QB in this case) to be both low (logically 0).

Figure 6:
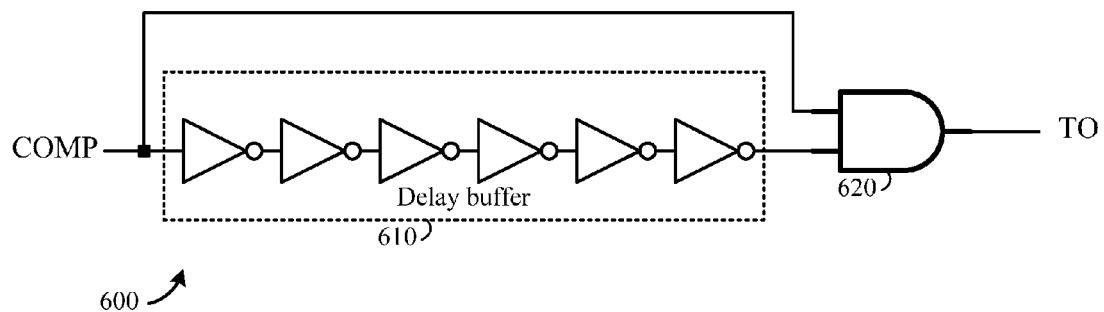
FIG. 6 shows a timer suitable for use in the SAR ADC of FIG. 2A and the SAR ADC of FIG. 2B.

A timer 600 suitable for embodying timer 250 (in both FIG. 2A and FIG. 2B) is depicted in FIG. 6. Timer 600 comprises a delay buffer 610 comprising a cascade of an even number of inverters and an AND gate 620. When the comparing signal COMP is de-asserted, the time out signal TO is also de-asserted. When the comparing signal COMP is asserted, the time out signal TO will be asserted after a delay of a certain time determined by a circuit delay of the delay buffer 610.

Now refer to FIG. 2B. In an alternative embodiment not shown in the figure, switch 222 is removed and the control signal for switch 220 is replaced with an alternative sampling signal SAMP' obtained from a logical OR operation of the sampling signal SAMP and the reset signal RST. In this alternative embodiment, the common circuit node 221 is connected to the ground node as either the sampling signal SAMP or the reset signal RST is asserted. Those of ordinary skills can easily tell that this alternative embodiment functions equivalently to ADC 200A of FIG. 2B.

Any process descriptions or blocks in flow diagrams should be understood as representing modules, segments, or portions of code which include one or more executable instructions for implementing specific logical functions or steps in the process, and alternate implementations are included within the scope of the preferred embodiment of the present disclosure in which functions may be executed out of order from that shown or discussed, including substantially concurrently or in reverse order, depending on the functionality involved, as would be understood by those reasonably skilled in the art of the present invention.

Although specific embodiments have been illustrated and described herein, it will be appreciated by those of ordinary skill in the art that any arrangement that is calculated to achieve the same purpose may be substituted for the specific embodiments shown. This application is intended to cover adaptations and variations of the embodiments discussed herein. Various embodiments use permutations and/or combinations of embodiments described herein. It is to be understood that the above description is intended to be illustrative, and not restrictive, and that the phraseology or terminology employed herein is for the purpose of description.

At least the following is claimed:

1. A SAR (successive-approximation register) ADC (analog-to-digital converter) comprising:
   a plurality of capacitors, each capacitor comprising a top plate and a bottom plate, wherein all top plates of said capacitors are electrically connected to a common node;
   a switch controlled by a sampling signal for connecting the common node to a ground node when the sampling signal is asserted;
   a plurality of switching networks, each switching network associated with a respective capacitor of the plurality of capacitors and controlled by the sampling signal and a plurality of control bits comprising a respective grounding bit and a respective data bit, each of the plurality of switching networks for connecting the bottom plate of the respective capacitor to an analog input signal if the sampling signal is asserted, or else to the ground node if the respective grounding bit is asserted, or else to a first reference voltage if the respective data bit is one, or else to a second reference voltage;
   a comparator for detecting a polarity of a voltage at the common node and outputting a decision signal when a comparing signal is asserted;
   a logic gate for outputting a ready signal according to the decision signal;
   a timer for receiving the comparing signal and outputting a time out signal; and
   a SAR logic for receiving the decision signal, the ready signal, and the time out signal and outputting the sampling signal, the comparing signal, the plurality of control bits, and an output data.

2. The SAR ADC of claim 1, wherein the SAR logic is further configured to:
   first enter a sampling state to cause the analog input signal to be sampled into the plurality of capacitors by asserting the sampling signal;
   assert all the grounding bits and set all the data bits to zero for all of the plurality of switching networks;
   de-assert the sampling signal;
   initialize an internal variable to an integer associated with a total count of the plurality of capacitors;
   takes an iteration process comprising a plurality of iterations to progressively de-assert the grounding bits; and
   determine the data bits for the plurality of switching networks so as to progressively reduce a magnitude of the voltage at the common node.

3. The SAR ADC of claim 2, wherein each iteration of the plurality of iterations comprises a compare state for asserting the comparing signal to command the comparator to output the binary decision indicating the polarity of the voltage at the common node.

4. The SAR ADC of claim 2, wherein each iteration of the plurality of iterations comprises a wait state for waiting for the ready signal and the time out signal, whichever comes first.

5. The SAR ADC of claim 4, wherein if the ready signal comes first, the binary decision is assigned to the data bit for the switching network indexed by the internal variable, or else a value independent of the binary decision is assigned to the data bit for the switching network indexed by the internal variable.

6. The SAR ADC of claim 2, wherein each iteration of the plurality of iterations further conditionally comprises an update voltage state if the internal variable has not yet reached a lower bound.

7. The SAR ADC of claim 6, wherein during the update voltage state:
   the voltage at the common node is updated in accordance with the binary decision of the switching network indexed by the internal variable;
   the internal variable is decremented; and
   the SAR logic proceeds to a next iteration.

8. The SAR ADC of claim 6, wherein if the internal variable has reached a lower bound, the SAR logic generates the output data using a weighted sum of data bits for the plurality of switching networks.

9. The SAR ADC of claim 1, wherein the respective capacitances of the plurality of capacitors either form a geometric sequence with a common ratio greater than one but less than two or a sequence wherein: every term except the first term in the sequence is less than the first term plus a sum of all terms preceding this term.

10. A method of analog-to-digital conversion comprising:
    (a) sampling an analog input signal into a plurality of capacitors;
    (b) initializing an internal variable to an upper bound associated with a total count of the plurality of capacitors;
    (c) commanding a comparator to start a comparison to detect a polarity of a voltage associated with the plurality of capacitors and setting off a timer to set an upper limit on a time the comparison may take;
    (d) setting a data bit indexed by an internal variable to a result of the comparison if the comparison is finished before a time set by the timer expires, else setting the data bit indexed by the internal variable to either one or zero independent of the result of the comparison;
    (e) adjusting the voltage associated with plurality of capacitors in accordance with the data bit indexed by the internal variable;
    (f) decrementing the internal variable; and
    (g) returning to step (c) if the internal variable has not yet reached a lower bound, else outputting an output data based on a weighted sum of all data bits set in step (d).

11. The method of claim 10, wherein each of the plurality of capacitors comprises a top plate and a bottom plate and all top plates of the plurality of capacitors are tied together to a common node, and wherein:
    in step (a), the common node is connected to a ground node and all bottom plates of the plurality of capacitors are connected to the analog input signal, and
    in step (b), the common node is disconnected from the ground node and all of the bottom plates of the plurality of capacitors are connected to the ground node.

12. The method of claim 11, wherein in step (c):
    the comparator detects the polarity of the voltage at the common node;
    the comparator outputs a binary decision along with a complementary binary decision;
    both the binary decision and the complementary decision are preset to one when the comparison starts; and
    the comparison is finished if either the binary decision or the complementary binary decision toggles to zero.

13. The method of claim 12, wherein in step (d):
    if the comparison is not finished before the time set by the timer expires, setting the data bit indexed by the internal variable to a default value.

14. The method of claim 10, wherein in step (e), adjusting the voltage associated with the plurality of capacitors in accordance with the data bit indexed by the internal variable comprises connecting the bottom plate of the capacitor indexed by the internal variable to either a first reference voltage or a second reference voltage depending on the value of the data bit indexed by the internal variable.

15. The method of claim 10, wherein the respective capacitances of the plurality of capacitors form either a geometric sequence with a common ratio greater than one but less than two or a sequence wherein: every term except the first term in the sequence is less than the first term plus a sum of all terms preceding this term.

16. A SAR (successive-approximation register) ADC (analog-to-digital converter) comprising:
 a plurality of capacitors, each comprising a top plate and a bottom plate, wherein all top plates of the plurality of capacitors are tied together to a common node;
 a switch for connecting the common node to a ground node when either a sampling signal or a reset signal is asserted;
 a plurality of switching networks, each associated with a respective capacitor of the plurality of capacitors and controlled by the sampling signal and a plurality of control bits comprising a respective grounding bit and a respective data bit, each of the plurality of switching networks for connecting the bottom plate of the respective capacitor to an analog input signal if the sampling signal is asserted, or else to the ground node if the respective grounding bit is asserted, or else to a first reference voltage if the respective data bit is one, or else to a second reference voltage;
 a comparator for detecting a polarity of the voltage at the common node and outputting a decision signal when a comparing signal is asserted;
 a logic gate for r outputting a ready signal according to the binary decision;
 a timer for receiving the comparing signal and outputting a time out signal; and
 a SAR logic for receiving the decision signal, the ready signal, and the time out signal and outputting the sampling signal, the reset signal, the control bits, and an output data, wherein the SAR logic operates either in a calibration mode where the sampling signal is never asserted or in a normal operation mode where the reset signal is never asserted.

17. The SAR ADC of claim 16, wherein in the calibration mode:
 the SAR logic is configured to first enter a reset state where the reset signal is asserted, the comparing signal is de-asserted, and all grounding bits are asserted, effectively clearing off charges on said capacitors;
 the SAR logic is configured to then enter an inject state where the reset signal is de-asserted, all data bits are set to zero except that the data bit corresponding to a capacitor under calibration is set to one, the grounding bit corresponding to the capacitor under calibration and all grounding bits corresponding to capacitors of less weight than the capacitor under calibration are set to zero; and
 the SAR logic is configured to then initialize an internal variable to an integer associated with an index of the capacitor under calibration, and takes an iteration process comprising a plurality of iterations to successively update the data bits for capacitors of less weight than the capacitor under calibration so as to minimize a magnitude of the voltage at the common node.

18. The SAR ADC of claim 17, wherein each iteration of the plurality of iterations further comprises a compare state for asserting the comparing signal to command the comparator to output the binary decision indicating the polarity of the voltage at the common node.

19. The SAR ADC of claim 17, wherein each iteration of the plurality of iterations further comprises a wait state for waiting for the ready signal and the time out signal, whichever comes first.

20. The SAR ADC of claim 19, wherein if the ready signal comes first, the binary decision is assigned to the data bit for the capacitor indexed by the internal variable, or else a value independent of the binary decision is assigned to the data bit for the capacitor indexed by the internal variable.

21. The SAR ADC of claim 17, wherein each iteration of the plurality of iterations further conditionally comprises an update voltage state if the internal variable has not yet reached a lower bound.

22. The SAR ADC of claim 21, wherein during the update voltage state:
 the voltage at the common node is updated in accordance with the binary decision of the switching network indexed by the internal variable;
 the internal variable is decremented; and
 then the SAR logic proceeds to a next iteration.

23. The SAR ADC of claim 22, wherein if the internal variable has reached the lower bound, the SAR logic generate a calibrated weight for the capacitor under calibration using a weighted sum of data bits for capacitors of less weight than the capacitor under calibration.

24. The SAR ADC of claim 16, wherein the respective capacitances of the plurality of capacitors form either a geometric sequence with a common ratio greater than one but less than two or a sequence wherein: every term except the first term in the sequence is less than the first term plus a sum of all terms preceding this term.

25. A method of calibrating an analog-to-digital converter comprising:
 (a) clearing off charges on a plurality of capacitors, wherein each capacitor is associated with a respective index;
 (b) establishing an initial charge on the plurality of capacitors by an amount representing a weight of a capacitor under calibration;
 (c) initializing an internal variable to the index associated with the capacitor under calibration;
 (d) commanding a comparator to start a comparison to detect a polarity of a voltage associated with the plurality of capacitors and setting off a timer to set an upper limit on the time the comparison may take;
 (e) setting a data bit associated with the capacitor indexed by the internal variable to a result of the comparison if the comparison is finished before a time set by the timer expires, else setting the data bit associated with the capacitor indexed by the internal variable to either one or zero without using the result of the comparison;
 (f) adjusting the voltage associated with the plurality of capacitors in accordance with the data bit associated with the capacitor indexed by the internal variable;
 (g) decrementing the internal variable; and
 (h) returning to step (d) if the internal variable has not yet reached a lower bound, else determining a calibrated weight for the capacitor under calibration based on a weighted sum of all data bits set in step (e).

26. The method of claim 25, wherein each capacitor of the plurality of capacitors comprises a top plate and a bottom plate, and all top plates of the plurality of capacitors are tied together to a common node.

27. The method of claim 26, wherein in step (a), the common node is connected to a ground node and all bottom plates of the plurality of capacitors are connected to the ground node.

28. The method of claim 27, wherein in step (b):

the common node is disconnected from the ground node;

the bottom plate of the capacitor under calibration is connected to a first reference voltage;

the bottom plate of every capacitor among said capacitors of more weight than the capacitor under calibration is connected to the ground node; and the bottom plate of every capacitor among the plurality of capacitors of less weight than the capacitor under calibration is connected to a second reference voltage.

29. The method of claim 28, wherein in step (d):

the comparator detects the polarity of the voltage at the common node;

the comparator outputs the binary decision along with a complementary binary decision;

both the binary decision and the complementary decision are preset to one when the comparison starts; and the comparison is finished if either the binary decision or the complementary binary decision toggles to zero.

30. The method of claim 29, wherein step (e) further comprises:

if the comparison is not finished before the time set by the timer expires, setting the data bit associated with the capacitor indexed by the internal variable to a default value.

31. The method of claim 25, wherein in step (f), adjusting the voltage associated with said capacitors in accordance with the data bit indexed by the internal variable comprises: connecting the bottom plate of the capacitor indexed by the internal variable to either a first reference voltage or a second reference voltage depending on the value of the data bit associated with the capacitor indexed by the internal variable.

32. The method of claim 25, wherein the respective capacitances of said capacitors form either a geometric sequence with a common ratio greater than one but less than two or a sequence wherein: every term except the first term in the sequence is less than the first term plus a sum of all terms preceding this term.

* * * * *